US010511080B2

(12) United States Patent
So et al.

(10) Patent No.: US 10,511,080 B2
(45) Date of Patent: Dec. 17, 2019

(54) FAN-OUT SEMICONDUCTOR PACKAGE

(71) Applicant: SAMSUNG ELECTRO-MECHANICS CO., LTD., Suwon-Si, Gyeonggi-Do (KR)

(72) Inventors: Won Wook So, Suwon-Si (KR); Yong Ho Baek, Suwon-Si (KR); Doo Il Kim, Suwon-Si (KR); Young Sik Hur, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/970,307

(22) Filed: May 3, 2018

(65) Prior Publication Data
US 2019/0058241 A1 Feb. 21, 2019

(30) Foreign Application Priority Data

Aug. 18, 2017 (KR) .................. 10-2017-0104569
Dec. 6, 2017 (KR) .................. 10-2017-0166562

(51) Int. Cl.
H01Q 1/48 (2006.01)
H01Q 1/22 (2006.01)
(Continued)

(52) U.S. Cl.
CPC ......... *H01Q 1/2283* (2013.01); *H01L 21/481* (2013.01); *H01L 23/49822* (2013.01);
(Continued)

(58) Field of Classification Search
CPC ........ H01Q 1/2283; H01Q 1/243; H01Q 1/48; H01Q 1/242; H01Q 1/38; H01L 23/66
(Continued)

(56) References Cited

U.S. PATENT DOCUMENTS 7,518,553 B2    4/2009  Zhang et al.
2012/0188138 A1 7/2012  Liu
(Continued)

FOREIGN PATENT DOCUMENTS

JP    2002-100698 A   4/2002
JP    2014-056925 A   3/2014
(Continued)

OTHER PUBLICATIONS

Office Action issued in corresponding Korean Application No. 10-2017-0166562, dated Mar. 10, 2019.
(Continued)

*Primary Examiner* — Graham P Smith
(74) *Attorney, Agent, or Firm* — Morgan, Lewis & Bockius LLP

(57) ABSTRACT

A fan-out semiconductor package includes: a core member including a plurality of insulating layers and a plurality of wiring layers and having a blind cavity penetrating through a portion of the plurality of insulating layers; a semiconductor chip disposed in the blind cavity; an encapsulant encapsulating at least portions of the core member and an active surface of the semiconductor chip and filling at least portions of the blind cavity; and a connection member disposed on the core member and an active surface of the semiconductor chip and including a redistribution layer connected to the connection pads. The plurality of wiring layers include antenna patterns and ground patterns, the antenna patterns and the ground patterns are disposed on different levels, and the antenna patterns are connected to the connection pads through the redistribution layer.

19 Claims, 14 Drawing Sheets

(51) Int. Cl.

| | |
|---|---|
| *H01L 23/00* | (2006.01) |
| *H01L 23/66* | (2006.01) |
| *H01L 23/498* | (2006.01) |
| *H01L 21/48* | (2006.01) |
| *H01Q 1/24* | (2006.01) |
| *H01Q 1/38* | (2006.01) |

(52) U.S. Cl.
CPC ........ *H01L 23/49894* (2013.01); *H01L 23/66* (2013.01); *H01L 24/19* (2013.01); *H01L 24/20* (2013.01); *H01L 24/24* (2013.01); *H01L 24/25* (2013.01); *H01L 24/82* (2013.01); *H01Q 1/243* (2013.01); *H01Q 1/38* (2013.01); *H01Q 1/48* (2013.01); *H01L 24/16* (2013.01); *H01L 24/32* (2013.01); *H01L 24/73* (2013.01); *H01L 24/92* (2013.01); *H01L 2223/6677* (2013.01); *H01L 2224/04105* (2013.01); *H01L 2224/12105* (2013.01); *H01L 2224/16227* (2013.01); *H01L 2224/24265* (2013.01); *H01L 2224/25171* (2013.01); *H01L 2224/32225* (2013.01); *H01L 2224/73204* (2013.01); *H01L 2224/73209* (2013.01); *H01L 2224/73267* (2013.01); *H01L 2224/821* (2013.01); *H01L 2224/8285* (2013.01); *H01L 2224/8289* (2013.01); *H01L 2224/92125* (2013.01); *H01L 2224/92244* (2013.01); *H01L 2924/15153* (2013.01); *H01L 2924/15174* (2013.01); *H01L 2924/15321* (2013.01); *H01L 2924/19011* (2013.01); *H01Q 1/242* (2013.01)

(58) Field of Classification Search
USPC .................................................... 343/848
See application file for complete search history.

(56) References Cited

U.S. PATENT DOCUMENTS

| | | |
|---|---|---|
| 2014/0070396 A1 | 3/2014 | Kyozuka et al. |
| 2014/0293529 A1 | 10/2014 | Nair et al. |
| 2016/0056544 A1 | 2/2016 | Garcia et al. |
| 2016/0240492 A1 | 8/2016 | Wolter et al. |
| 2017/0033062 A1 | 2/2017 | Liu et al. |
| 2017/0213794 A1 | 7/2017 | Baek et al. |
| 2017/0236776 A1 | 8/2017 | Huynh et al. |

FOREIGN PATENT DOCUMENTS

| | | |
|---|---|---|
| KR | 10-2017-0071826 A | 6/2017 |
| KR | 10-2017-0088194 A | 8/2017 |

OTHER PUBLICATIONS

Taiwanese Notice of Allowance dated Feb. 12, 2019 issued in Taiwanese Patent Application No. 107115673 (with partial English Translation).

Office Action issued in Korean Patent Application No. 10-2017-0166562 issued Sep. 28, 2019, with English translation.

FAN-OUT SEMICONDUCTOR PACKAGE

CROSS-REFERENCE TO RELATED APPLICATION(S)

This application claims benefit of priority to Korean Patent Application Nos. 10-2017-0104569 filed on Aug. 18, 2017 and 10-2017-0166562 filed on Dec. 6, 2017 in the Korean Intellectual Property Office, the disclosure of which is incorporated herein by reference in its entirety.

TECHNICAL FIELD

The present disclosure relates to a fan-out semiconductor package in which an antenna pattern and a ground pattern are formed.

BACKGROUND

Applications using a millimeter wave of 10 GHz or more have been widely used for motion sensor products that detect motion to increase user interface (I/F) convenience, action monitoring sensor products for security that confirm an intruder in a predetermined space, 24 GHz and 77 GHz radar systems for near-field and far-field detection for an automobile, and the like, as well as fifth generation (5G) communications for mobile or 60 GHz communications. In a case of the product using the millimeter wave as described above, when a signal is transferred from a radio frequency integrated circuit (RFIC) to an antenna or from the antenna to the RFIC, the signal should be transferred so that loss of the signal is not generated as much as possible.

Conventionally, to this end, the RFIC and the antenna are connected to each other through a coaxial cable to minimize signal attenuation, which is inefficient in terms of a space and a cost.

Recently, in a 60 GHz communications system, a manner of designing a 60 GHz antenna using a material such as a low temperature co-fired ceramic (LTCC), or the like, and then attaching the 60 GHz antenna onto the RFIC to significantly reduce a distance between components has started to be used. In addition, in a radar system for an automobile, a manner of mounting the RFIC on a main printed circuit board (PCB) and forming and connecting the antenna as patterns on and to the main PCB or mounting a separate antenna module to the main PCB has been used. However, also in this manner, it is difficult to sufficiently prevent generation of line-to-line loss between components.

Recently, in accordance with the development of package technology, a method of forming an antenna in an RFIC package has been developed, and a manner of forming antenna patterns on redistribution layers (RDL) of the RFIC package has been used in some cases. However, also in this manner, there are several design limitations in securing radiation performance of the antenna or there is the possibility that an error of performance will occur. Therefore, stable RFIC and antenna integration package design technology capable of having a flexible degree of freedom in a design and significantly reducing a design error has been required.

SUMMARY

An aspect of the present disclosure may provide a fan-out semiconductor package in which loss of a signal transfer may be prevented by significantly reducing a distance between a semiconductor chip and an antenna pattern, stable antenna performance may be secured in a single package, an overall size of a package may be reduced, and a process may be simplified.

According to an aspect of the present disclosure, a fan-out semiconductor package may be provided, in which a semiconductor chip and an antenna are integrated in a single package using a blind cavity.

According to an aspect of the present disclosure, a fan-out semiconductor package may include: a core member including a plurality of insulating layers and a plurality of wiring layers and having a blind cavity penetrating through a portion of the plurality of insulating layers; a semiconductor chip disposed in the blind cavity and having an active surface having connection pads disposed thereon and an inactive surface opposing the active surface; an encapsulant encapsulating at least portions of the core member and the active surface of the semiconductor chip and filling at least portions of the blind cavity; and a connection member disposed on the core member and the active surface of the semiconductor chip and including a redistribution layer connected to the connection pads, wherein the plurality of wiring layers include antenna patterns and ground patterns, the antenna patterns and the ground patterns are disposed on different levels, and the antenna patterns are connected to the connection pads through the redistribution layer. The plurality of wiring layers may further include a barrier pattern, portions of the barrier patterns may be exposed by the blind cavity, and the inactive surface of the semiconductor chip may be attached to exposed one surface of the barrier pattern.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
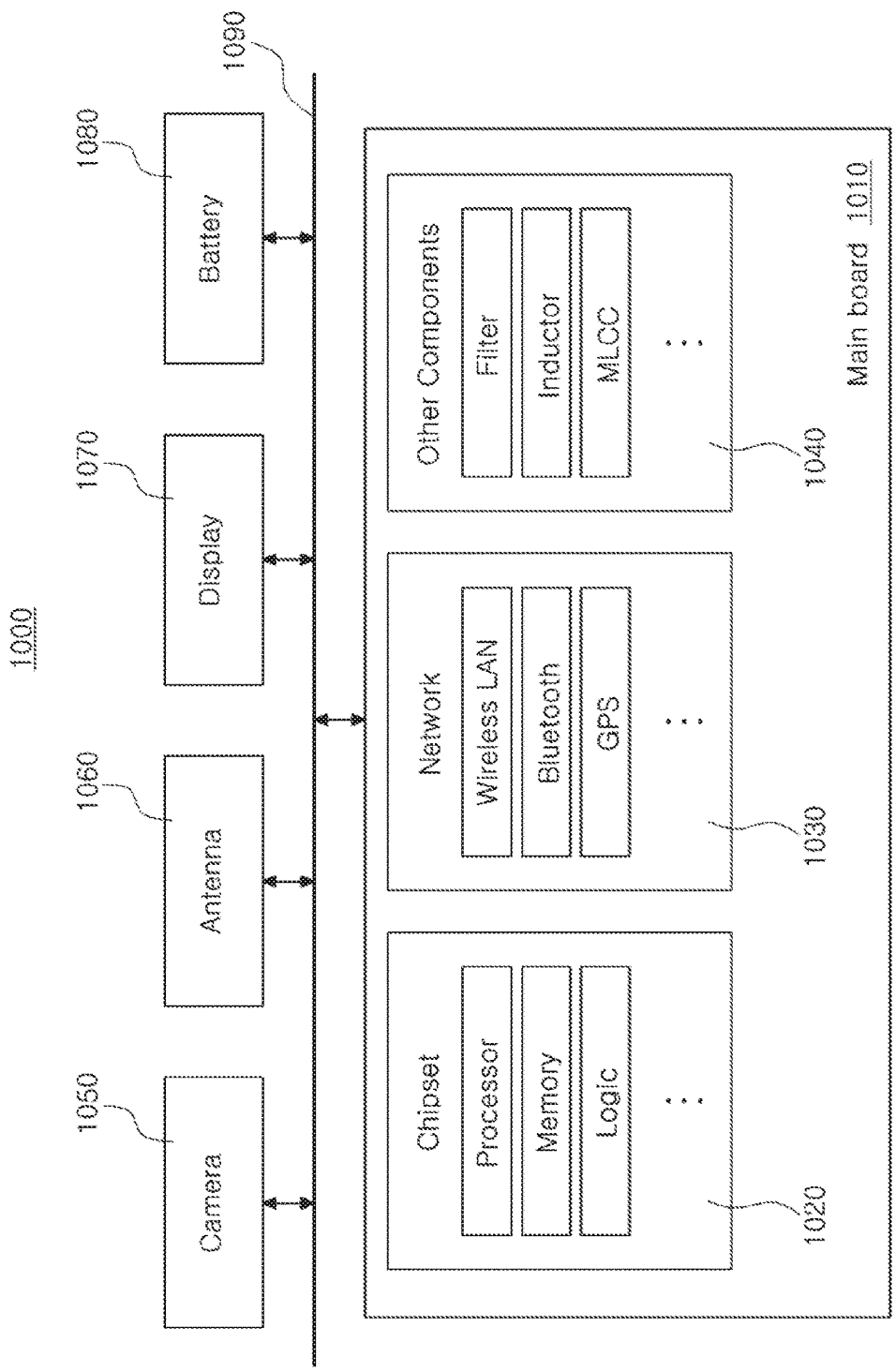
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, a term "electrically connected or connected in a signal manner" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
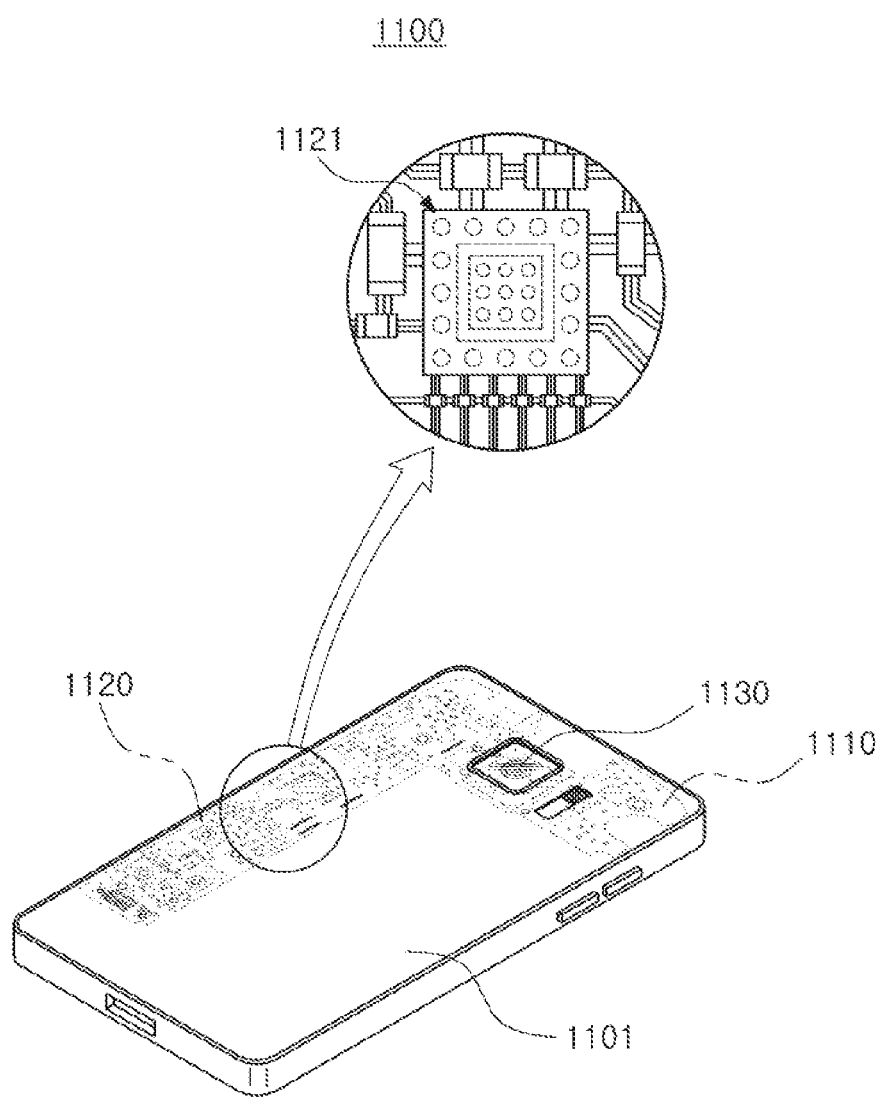
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
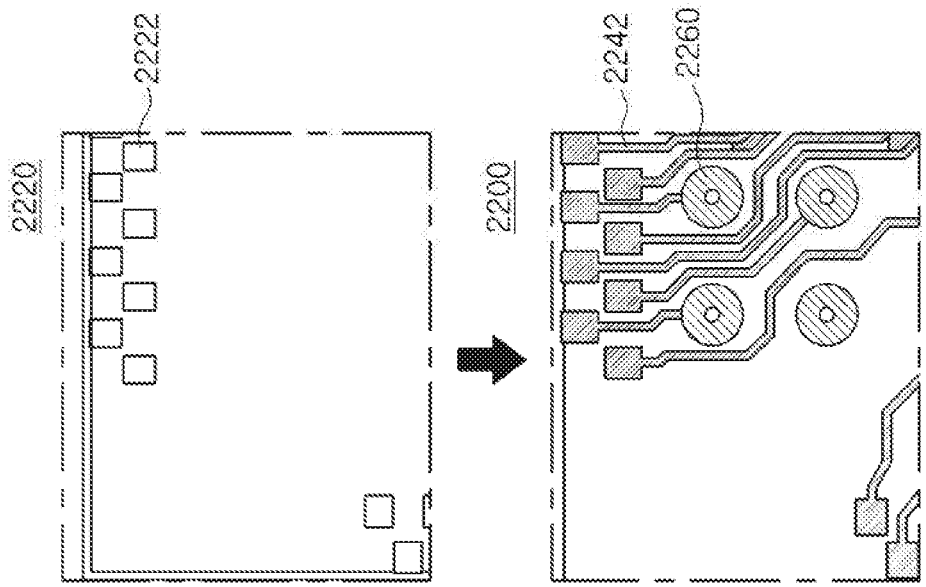
FIGS. 3A and 3B are schematic cross-sectional views illustrating states of a fan-in semiconductor package before and after being packaged.
Figure 3A:
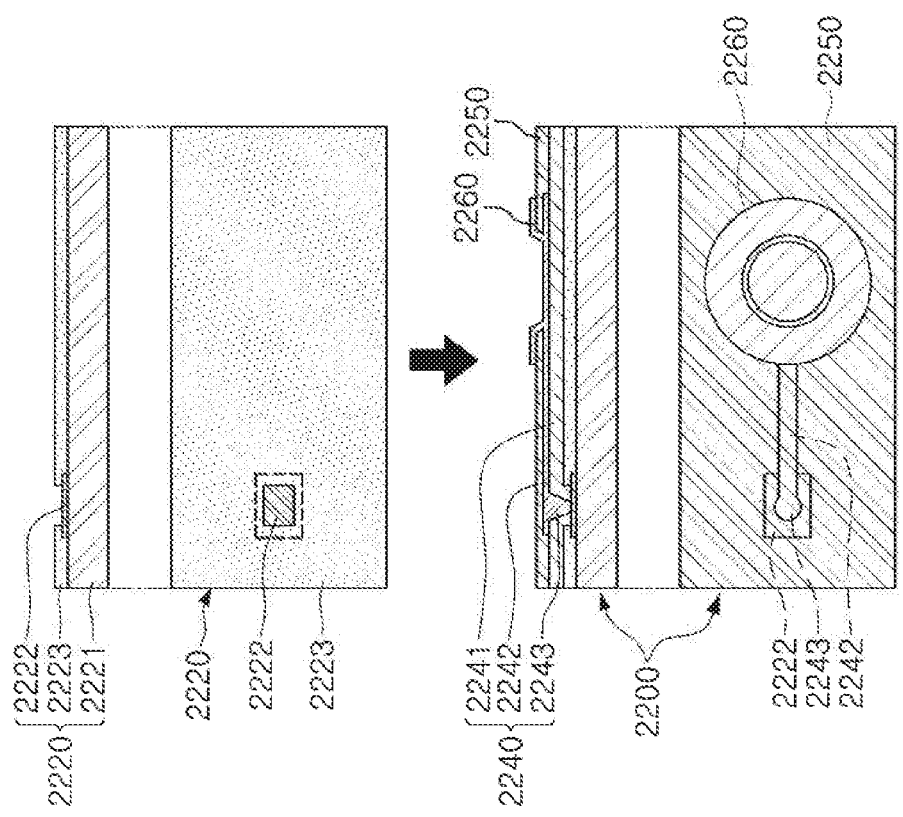

FIGS. 3A and 3B are schematic cross-sectional views illustrating states of a fan-in semiconductor package before and after being packaged.

Figure 4:
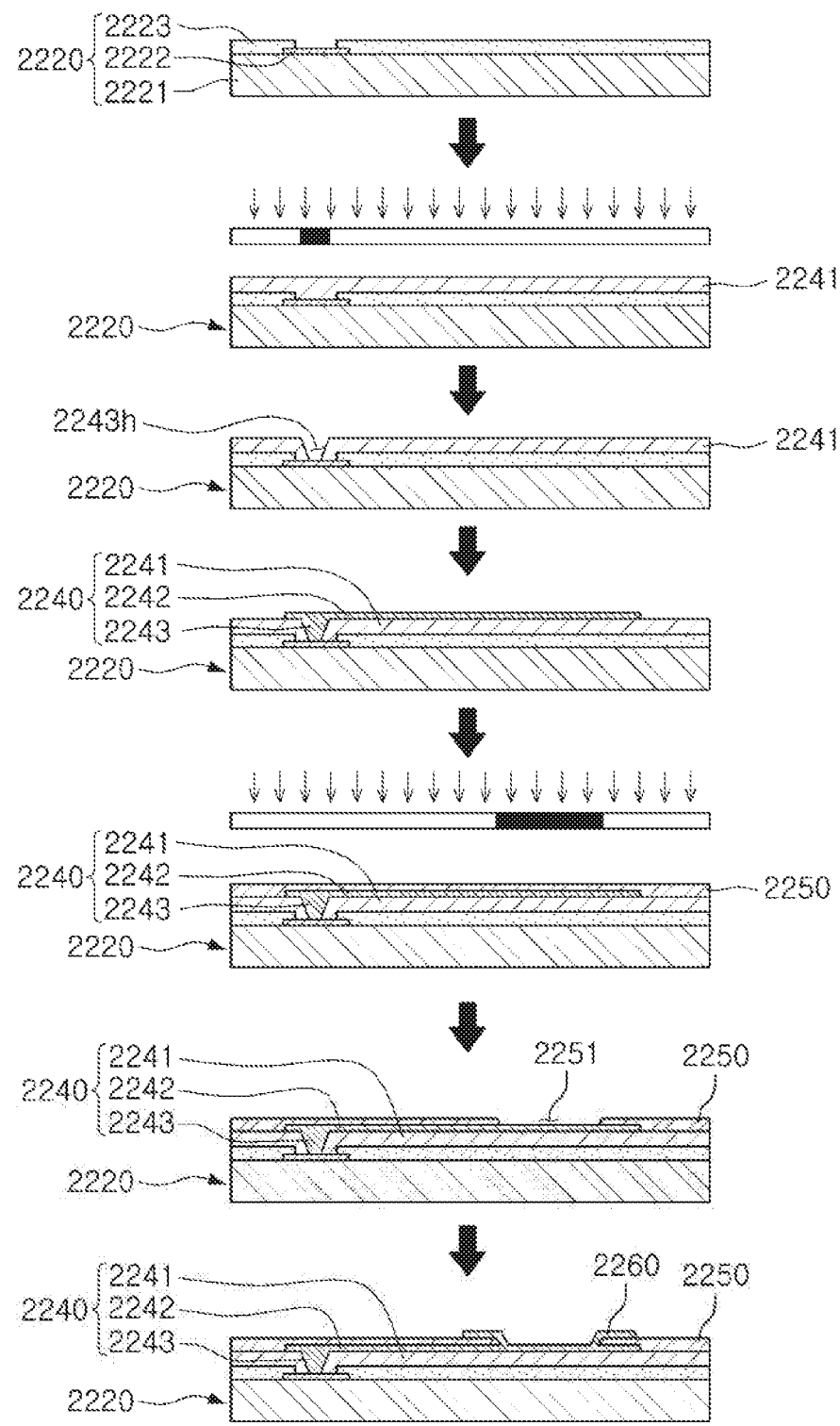
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
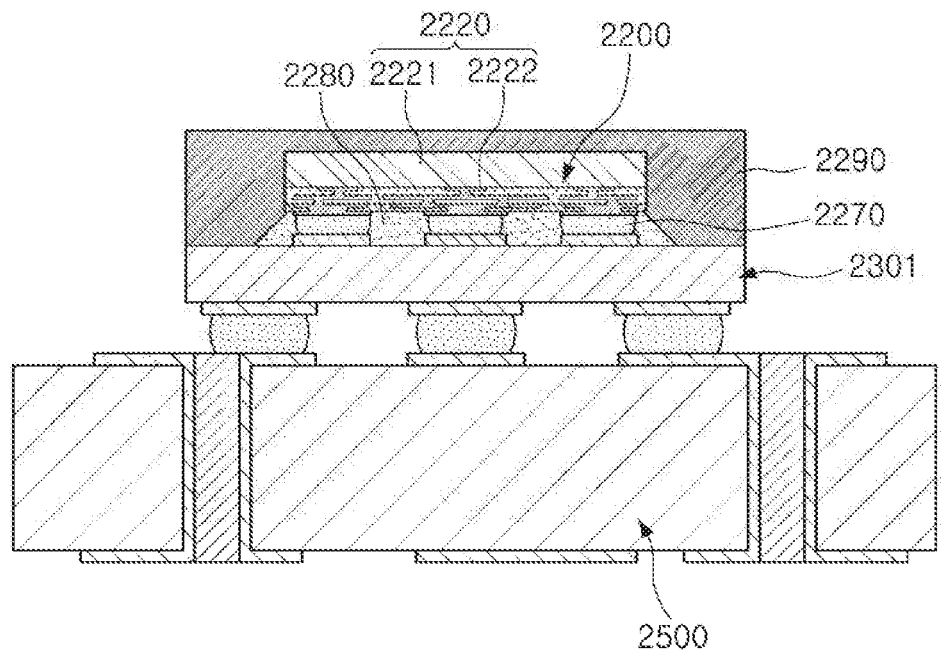
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
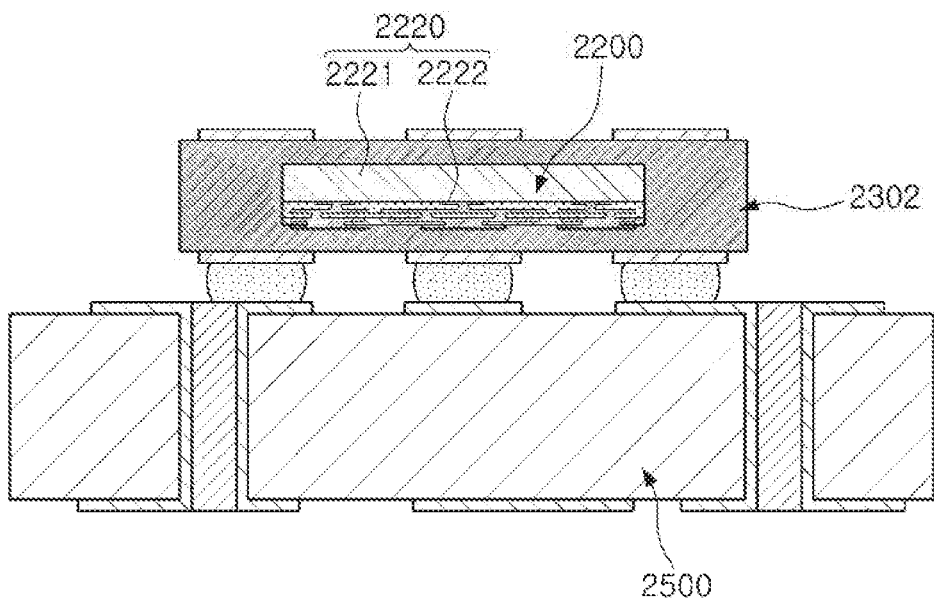
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
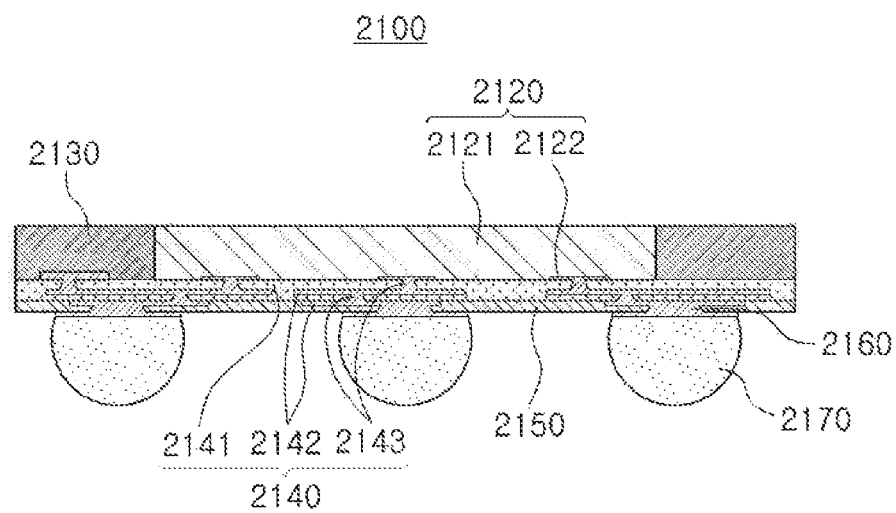
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
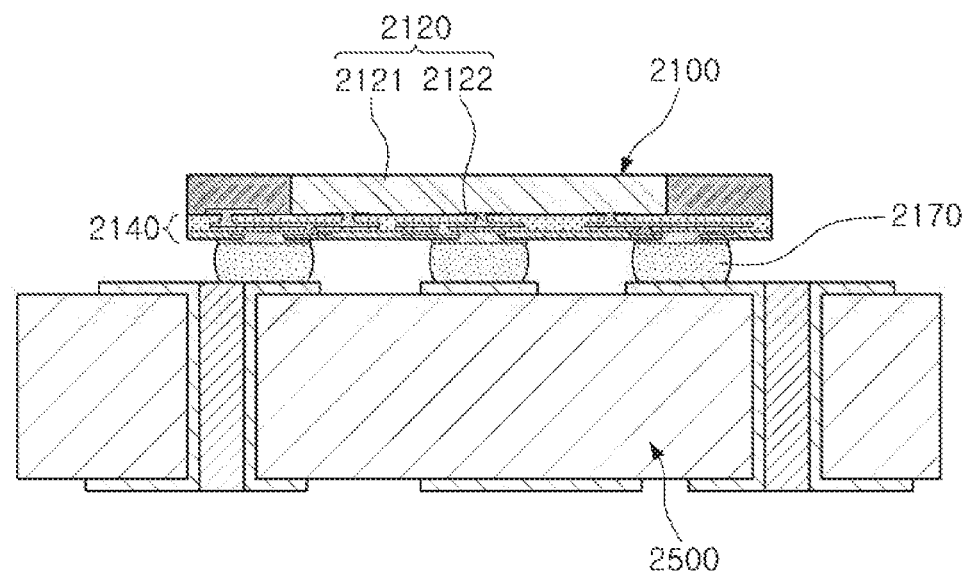
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A fan-out semiconductor package in which a core member having an antenna pattern and a ground pattern formed therein is introduced will hereinafter be described with reference to the drawings.

Fan-Out Semiconductor Package

Figure 9:
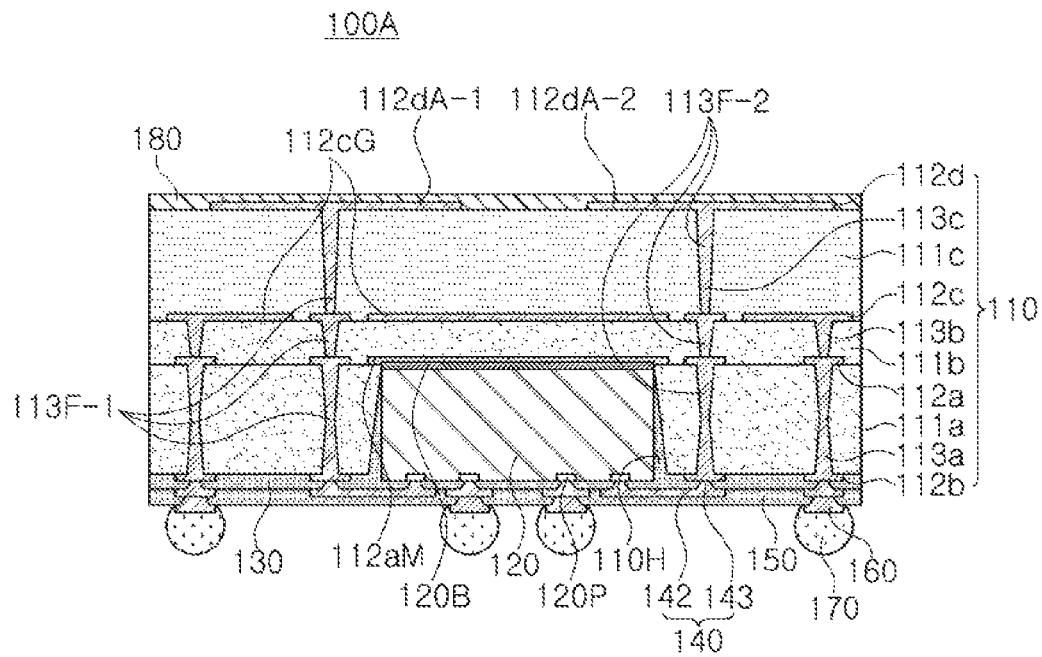
FIG. 9 is a schematic cross-sectional view illustrating an example of a fan-out semiconductor package.

FIG. 9 is a schematic cross-sectional view illustrating an example of a fan-out semiconductor package.

Figure 10:
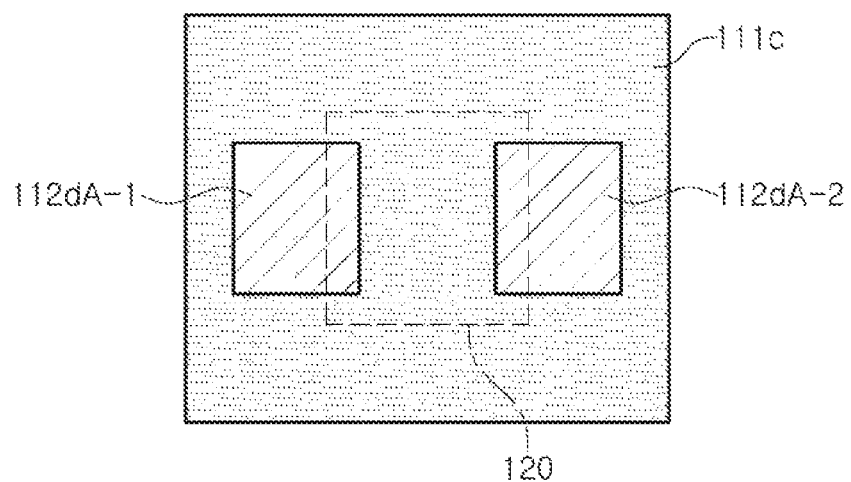
FIG. 10 is a schematic plan view illustrating the fan-out semiconductor package of FIG. 9 when viewed from above.

FIG. 10 is a schematic plan view illustrating the fan-out semiconductor package of FIG. 9 when viewed from above.

Figure 11A:
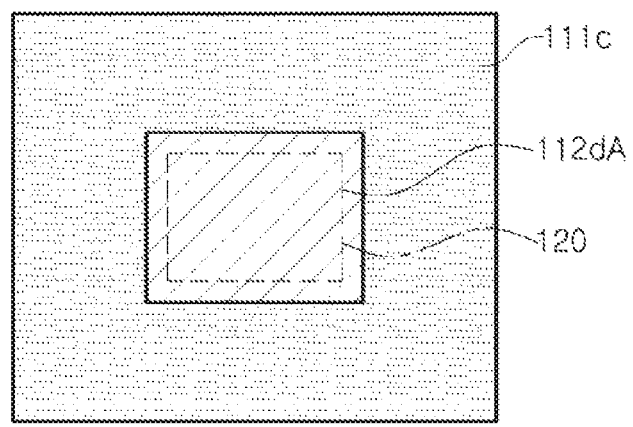
FIGS. 11A and 11B are schematic plan views illustrating various examples of the fan-out semiconductor package of FIG. 9 when viewed from above.
Figure 11B:
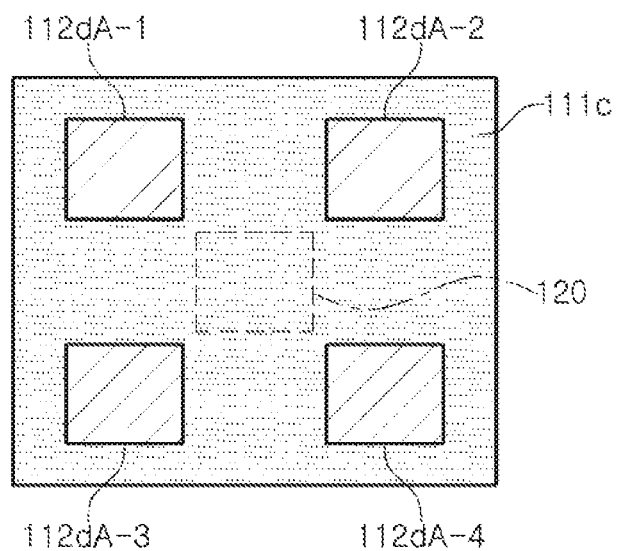

FIGS. 11A and 11B are schematic plan views illustrating various examples of the fan-out semiconductor package of FIG. 9 when viewed from above.

Referring to FIGS. 9 through 11, a fan-out semiconductor package 100A according to an exemplary embodiment in the present disclosure may include a core member 110 having a blind cavity 110H of which a first surface is closed by a barrier pattern 112*a*M, a semiconductor chip 120 having an active surface having connection pads 120P disposed thereon and an inactive surface opposing the active surface and disposed in the blind cavity 110H of the core member 110 so that the inactive surface is attached to the barrier pattern 112*a*M, an encapsulant 130 encapsulating at least portions of the core member 110 and the active surface of the semiconductor chip 120 and filling at least portions of the blind cavity 110H, and a connection member 140 disposed on the core member 110 and the active surface of the semiconductor chip 120 and including a redistribution layer 142 connected to the connection pads 120P. If necessary, a passivation layer 150 having openings exposing at least portions of the redistribution layer 142 may be disposed on the connection member 140, and an underbump metal layer 160 and/or electrical connection structures 170 connected to the exposed redistribution layer 142 may be disposed on the passivation layer 150. In addition, a cover layer 180 covering antenna patterns 112dA-1 and 112dA-2 may be disposed on the core member 110.

The core member 110 may include a plurality of insulating layers 111a, 111b, and 111c, a plurality of wiring layers 112a, 112b, 112c, and 112d, and a plurality of vias 113a, 113b, and 113c. In this case, a fourth wiring layer 112d may include the antenna patterns 112dA-1 and 112dA-2. In addition, a third wiring layer 112c may include ground patterns 112cG. The antenna patterns 112dA-1 and 112dA-2 may be connected to the redistribution layer 142 through feeding lines 113F1 and 113F2, and may be connected to the connection pads 120P through the redistribution layer 142. As described above, in the fan-out semiconductor package 100A according to the exemplary embodiment, the core member 110 having the blind cavity 110H having a blind form may be introduced to integrate the semiconductor chip 120 and the antenna patterns 112dA-1 and 112dA-2 in a single fan-out semiconductor package 100A.

Meanwhile, in a case in which an antenna is formed together with a radio frequency integrated circuit (RFIC) in one package, it needs to be considered how to implement an antenna, a ground face, a dielectric material, a feeding line, and the like, in order to determine a resonance frequency and a bandwidth of the antenna. For example, a distance between the antenna and the ground face that has a sensitive influence on characteristics of the antenna, that is, a thickness of an air layer or a thickness of a dielectric material needs to be constantly maintained and managed in order to secure stable radiation characteristics of the antenna.

Figure 17:
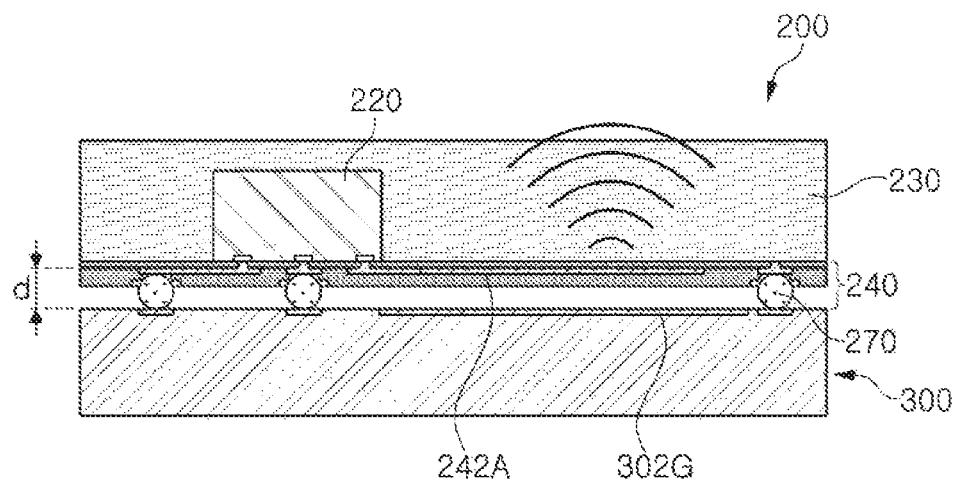
FIG. 17 is a schematic cross-sectional view illustrating an example in which a fan-out semiconductor package according to the related art is applied to a mainboard.

In a case of the related art, as illustrated by way of example in FIG. 17, a manner of forming an antenna 242A on a redistribution layer 240 of a package 200 and forming a ground face 302G on a mainboard 300 is used. In this case, a thickness or a distance d between the antenna 242A and the ground face 302G needs to be secured by a height of solder balls 270 of the package 200A. Therefore, when the package 200A is mounted on the mainboard 300, a thickness difference may be generated depending on a height level in which the solder ball collapse. In addition, in this case, a dielectric material is used as a material of the air layer, and a size of the antenna 242A is thus increased. In addition, in this case, a flux or a foreign material may be inserted into a space between the antenna 242A and the ground face 302G, resulting in significantly influence on characteristics of the antenna 242A. In addition, in this case, when heat is generated in the RFIC 220, it is difficult to secure a sufficient heat dissipation path, and thus, there is a limitation in using such a manner in a product usings a large amount of power.

Figure 18:
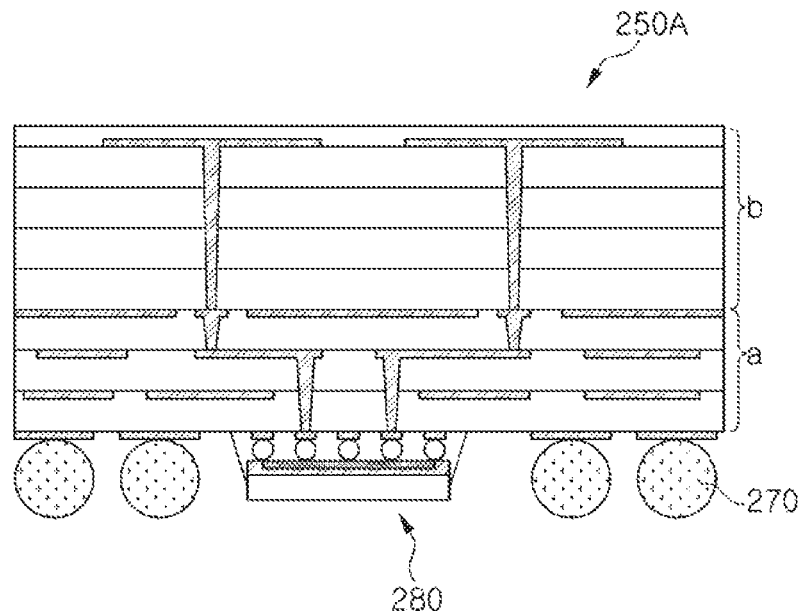
FIG. 18 is a schematic cross-sectional view illustrating an example of a stack type antenna integrated module according to the related art.
Figure 19:
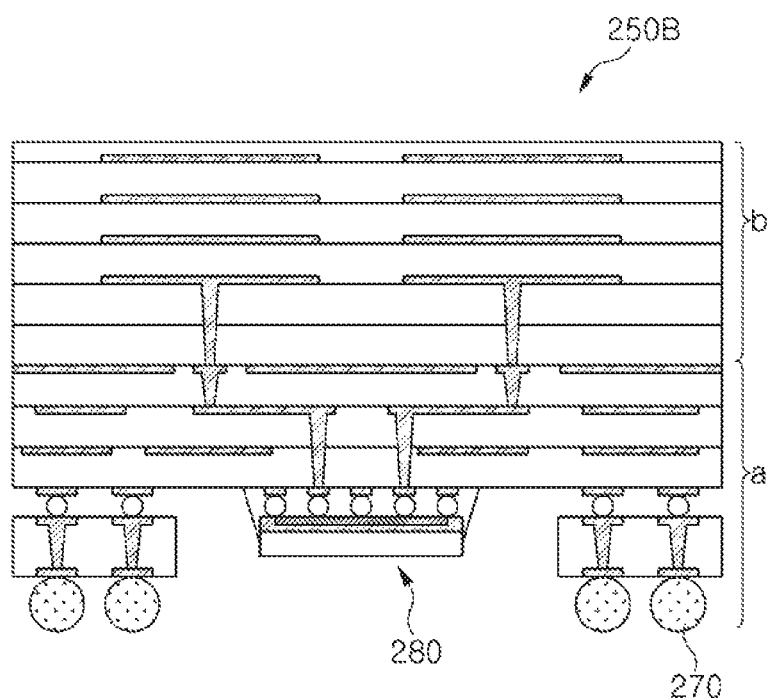
FIG. 19 is a schematic cross-sectional view illustrating another example of a stack type antenna integrated module according to the related art.

In addition, in a case of the related art, as illustrated by way of example in FIGS. 18 and 19, an integrated module manufactured by stacking an RFIC package 280 packaged in an existing manner in a 60 GHz communications system on an antenna board 250A or 250B is used. In these products, an antenna pattern portion b including antenna patterns and a ground and a wiring portion a for RFIC signal redistribution are implemented on the antenna board 250A or 250B having a multilayer PCB form, and the RFIC package 280 is attached to a lower surface of the antenna board 250A or 250B. Therefore, an entire thickness of a package module is increased, such that there may be a limitation in using the package module in mobile products or small Internet of things (IoT) products, and a process of manufacturing the package module is complicated. In addition, some products have a problem such as securing of the height of the solder balls 270 described above.

On the other hand, in the fan-out semiconductor package 100A according to the exemplary embodiment, the core member 110 may be introduced, the antenna patterns 112dA-1 and 112dA-2 and the ground patterns 112cG may be formed in an upper portion of the core member 110, the blind cavity 110H having the blind form may be formed in a lower portion of the core member 110, the semiconductor chip 120 such as an RFIC, or the like, may be disposed in the blind cavity 110H, and the feeding lines 113F-1 and 113F-2 may be implemented by the vias 113a, 113b, and 113c of the core member 110. Therefore, a distance between the antenna patterns 112dA-1 and 112dA-2 and the ground patterns 112cG may be stably secured in a single package regardless of a change in an external environment to maintain radiation characteristics of the antenna patterns 112dA-1 and 112dA-2. Nevertheless, a signal path between the antenna patterns 112dA-1 and 112dA-2 and the semiconductor chip 120 such as the RFIC, or the like, may be significantly reduced to secure stable radio frequency (RF) characteristics. In addition, sizes of the antenna patterns 112dA-1 and 112dA-2 may be reduced using dielectric constants of the respective insulating layers 111a, 111b, and 111c of the core member 110 to reduce an overall size of the fan-out semiconductor package 100A, resulting in improvement of spatial efficiency and reduction in a cost. In addition, the possibility that foreign materials will be disposed in a space between the antenna patterns 112dA-1 and 112dA-2 and the ground patterns 112cG may be significantly low, such that deterioration of performance of the antenna patterns 112dA-1 and 112dA-2 due to the foreign materials may be prevented. In addition, the electrical connection structures 170 are not limited to solder balls, and may be implemented in a small thickness.

Meanwhile, a term "connected" herein conceptually includes a case in which components are electrically connected to each other or are connected in a signal manner as well as a case in which components are physically connected to each other. In addition, the term 'connected' is a concept including an indirect connection as well as a direct connection. In addition, a term "electrically connected or connected in a signal manner" is a concept including a physical connection and a physical disconnection.

Components of the fan-out semiconductor package 100A according to the exemplary embodiment will hereinafter be described in more detail.

The core member 110 may provide the antenna patterns 112dA-1 and 112dA-2, the ground patterns 112cG, various redistribution patterns for the connection pads 120P, and the like. The core member 110 may improve rigidity of the fan-out semiconductor package 100A depending on certain materials, and serve to secure uniformity of a thickness of the encapsulant 130. The core member 110 may have the blind cavity 110H. The first surface of the blind cavity 110H may be closed by the barrier pattern 112aM, and the inactive surface of the semiconductor chip 120 may be attached to the barrier pattern 112aM of the blind cavity 110H through an adhesion member 120B such as a die attach film (DAF).

Side surfaces of the semiconductor chip 120 may be surrounded by walls of the blind cavity 110H of the core member 110. The blind cavity 110H may be formed by a sandblast process. In this case, a cross section of the blind cavity 110H may have a tapered shape. That is, the walls of the blind cavity 110H may have a gradient of an acute angle in relation to the barrier pattern 112aM. In this case, a process of aligning the semiconductor chip 120 may be easy, and a yield of the semiconductor chip 120 may thus be improved.

The core member 110 may include a first insulating layer 111a, a first wiring layer 112a disposed on a first surface of the first insulating layer 111a, a second wiring layer 112b disposed on a second surface of the first insulating layer 111a, a second insulating layer 111b disposed on the first surface of the first insulating layer 111a and covering the first wiring layer 112a, a third wiring layer 112c disposed on the second insulating layer 111b, a third insulating layer 111c disposed on the second insulating layer 111b and covering the third wiring layer 112c, and a fourth wiring layer 112d disposed on the third insulating layer 111c. In addition, the core member 110 may include first vias 113a penetrating through the first insulating layer 111a and connecting the first and second wiring layers 112a and 112b to each other, second vias 113b penetrating through the second insulating layer 111b and connecting the first and third wiring layers 112a and 112c to each other, and third vias 113c penetrating through the third insulating layer 111c and connecting the third and fourth wiring layers 112c and 112d to each other. The first to fourth wiring layers 112a, 112b, 112c, and 112d may be connected to the connection pads 120 of the semiconductor chip 120 through the redistribution layer 142.

The barrier pattern 112aM may be disposed on the first surface of the first insulating layer 111a, and a first surface of the barrier pattern 112aM may be covered by the second insulating layer 111b and at least a portion of a second surface of the barrier pattern 112aM opposing the first surface of the barrier pattern 112aM may be exposed by the blind cavity 110H. The blind cavity 110H may penetrate through the first insulating layer 111a. The walls of the blind cavity 110H formed in the first insulating layer 111a may have the gradient of the acute angle. A thickness of an edge region of the barrier pattern 112aM in contact with the first insulating layer 111a may be greater than that of a region of the barrier pattern 112aM exposed from the first insulating layer 111a by the blind cavity 110H. The reason is that a portion of the exposed region may also be removed in a sandblast process. The barrier pattern 112aM may be a metal plate including copper (Cu). However, the barrier pattern 112aM is not limited thereto, but may also be an insulating film including a photosensitive material, such as a dry film.

A material of each of the insulating layers 111a, 111b, and 111c is not particularly limited. For example, an insulating material may be used as the material of each of the insulating layers 111a, 111b, and 111c. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. The respective insulating layers 111a, 111b, and 111c may include the same material or include different materials. As a non-restrictive example, the material of the first insulating layer 111a may be a material having low dielectric constant characteristics for reducing loss of a filter, and the material of the third insulating layer 111c may be a material having high dielectric constant characteristics for reducing a size of an antenna, or vice versa. Among the first to third insulating layers 111a, 111b, and 111c, the insulating layer 111c on which the antenna patterns 112aA-1 and 112dA-2 are directly disposed may have the greatest dielectric constant. The first and third insulating layers 111a and 111c may have thicknesses greater than that of the second insulating layer 111b. The first insulating layer 111a may have a thickness corresponding to that of the semiconductor chip 120, and the third insulating layer 111c may have a thickness enough to secure a distance between the antenna patterns 112dA-1 and 112dA-2 and the ground patterns 112cG.

A material of each of the wiring layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The wiring layers 112a, 112b, 112c, and 112d may perform various functions depending on designs of corresponding layers. The first and second wiring layers 112a and 112b may include general redistribution patterns such as signal lines, power lines, ground lines, signal pads, power pads, ground pads, and the like. The second wiring layer 112b may include the barrier pattern 112aM, which may also be utilized as a ground. The third wiring layer 112c may include the ground patterns 112cG. The ground patterns 112cG may occupy most of an upper surface of the second insulating layer 111b. The ground patterns 112cG may serve as a ground of various signal patterns, and the like, as well as the antenna patterns 112dA-1 and 112dA-2. The fourth wiring layer 112d may include the antenna patterns 112dA-1 and 112dA-2. The antenna patterns 112dA-1 and 112dA-2 may be a patch antenna or be an array antenna. Alternatively, the antenna patterns 112dA-1 and 112dA-2 may be a folded dipole antenna or be a coplanar patch antenna. Alternatively, the antenna patterns 112dA-1 and 112dA-2 may be a ring antenna, a loop antenna, or the like, and the respective antennas may have various shapes such as a rectangular shape, a square shape, a circular shape, a radial shape, and the like. Meanwhile, the antenna patterns 112dA-1 and 112dA-2 may be a single antenna 112dA in which a transmit (Tx) antenna and a receive (Rx) antenna are formed as illustrated in FIG. 11A, or may be a plurality of antennas 112dA-1, 112dA-2, 112dA-3, and 112dA-4 having a larger number and separated from one another as illustrated in FIG. 11B. Meanwhile, the fourth wiring layer 112d may include filter patterns (not illustrated) such as microstrip lines, strip lines, and the like.

The vias 113a, 113b, and 113c may connect the wiring layers 112a, 112b, 112c, and 112d formed on different layers to each other. The vias 113a, 113b, and 113c may include vias for a signal connection or vias for a ground connection. A material of each of the 113a, 113b, and 113c may be a conductive material such as copper (Cu), aluminum (Al), silver (Ag), tin (Sn), gold (Au), nickel (Ni), lead (Pb), titanium (Ti), or alloys thereof. Each of the vias 113a, 113b, and 113c may be completely filled with the conductive material, or the conductive material may also be formed along a wall of each of via holes. In addition, each of the vias 113a, 113b, and 113 may have a hourglass shape, a cylindrical shape, a tapered shape, and the like. The vias 113a, 113b, and 113 may provide the feeding lines 113F-1 and 113F-2 for the antenna patterns 112dA-1 and 112dA-2.

The semiconductor chip 120 may be an integrated circuit (IC) in a bare state, provided in an amount of several hundred to several million or more elements integrated in a single chip. The integrated circuit (IC) may be, for example, a radio frequency integrated circuit (RFIC). That is, the fan-out semiconductor package 100A according to the exemplary embodiment may be a package in which the RFIC and a millimeter wave/5G antenna are integrated with each other. The semiconductor chip 120 may include a body on which various circuits are formed, and the connection pads 120P may be formed on an active surface of the body. The body may be formed on the basis of, for example, an active wafer. In this case, a base material of the body may be silicon (Si), germanium (Ge), gallium arsenide (GaAs), or the like. The connection pads 120P may electrically connect the semiconductor chip 120 to other components, and a material of each of the connection pads 120P may be a conductive material such as aluminum (Al), but is not limited thereto. The active surface of the semiconductor chip 120 refers to a surface of the semiconductor chip 120 on which the connection pads 120P are disposed, and the inactive surface of the semiconductor chip 120 refers to a surface of the semiconductor chip 120 opposing the active surface. In the exemplary embodiment, the semiconductor chip 120 may be disposed in the blind cavity 110H of the core member 110 so that the inactive surface of the semiconductor chip 120 is attached to the barrier pattern 112aM. The adhesion member 120B, or the like, may be used to attach the inactive surface of the semiconductor chip 120 to the barrier pattern 112aM.

The encapsulant 130 may be configured to protect the semiconductor chip 120 and provide an insulation region. An encapsulation form of the encapsulant 130 is not particularly limited, and may be a form in which the encapsulant 130 surrounds at least portions of the semiconductor chip 120. For example, the encapsulant 130 may cover a lower surface of the core member 110, and cover side surface and the active surface of the semiconductor chip 120. In addition, the encapsulant 130 may fill a space in the blind cavity 110H. The certain materials of the encapsulant 130 are not particularly limited, but may be an insulating material such as ABF. Alternatively, a photoimagable encapsulant (PIE) may be used as the material of the encapsulant 130.

The connection member 140 may serve to connect the fan-out semiconductor package 100A according to the exemplary embodiment to an external component. In addition, the connection member 140 may redistribute the connection pads 120P of the semiconductor chip 120. The connection member 140 may include the redistribution layer 142 disposed on the encapsulant 130 and vias 143 penetrating through the encapsulant 130 and connecting the redistribution layer 142 to the second wiring layer 112b and the connection pads 120P. In the exemplary embodiment, a case in which the redistribution layer 142 and the vias 143 are formed on and in the encapsulant 130 is illustrated, but a larger number of redistribution layers and vias may be formed by adding insulating layers formed by additionally applying and hardening a PID, or the like, to the encapsulant 130, if necessary.

The redistribution layer 142 may serve to redistribute the connection pads 120P of the semiconductor chip 120, and a material of the redistribution layer 142 may be a conductive material such as copper (Cu), aluminum (Al), silver (Ag), tin (Sn), gold (Au), nickel (Ni), lead (Pb), titanium (Ti), or alloys thereof. The redistribution layer 142 may perform various functions depending on a design of a corresponding layer. For example, the redistribution layer 140 may include ground lines, signal lines, and the like. In addition, the redistribution layer 140 may include pads for a ground, pads for a signal, and the like. Meanwhile, single-die packaging may be performed on the RFIC using fan-out panel level package (FO-PLP) technology, only inputs/outputs (I/Os) for antenna feeding lines and a ground connection may be formed on a top surface of a core portion of the RFIC, and I/Os for RF input, control signals, power, a ground connection may be formed on a bottom surface thereof.

The vias 143 may electrically connect the redistribution layer 142, the connection pads 120P, the second wiring layer 112b, and the like, formed on different layers to each other. A material of each of the vias 143 may be a conductive material such as copper (Cu), aluminum (Al), silver (Ag), tin (Sn), gold (Au), nickel (Ni), lead (Pb), titanium (Ti), or alloys thereof. The each of vias 143 may be completely filled with the conductive material, or the conductive material may also be formed along a wall of each of the vias. In addition, each of the vias 143 may have a tapered shape, or the like. The vias 143 may also include vias for a ground, and vias for a signal, and the like.

The passivation layer 150 may be additionally configured to protect the connection member 140 from external physical or chemical damage. The passivation layer 150 may have the openings exposing at least portions of the redistribution layer 142 of the connection member 140. The number of openings formed in the passivation layer 150 may be several tens to several millions. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metal layer 160 may be additionally configured to improve connection reliability of the electrical connection structures 170 to improve board level reliability of the fan-out semiconductor package 100A. The underbump metal layer 160 may be connected to the redistribution layer 142 of the connection member 140 exposed through the openings of the passivation layer 150. The underbump metal layer 160 may be formed in the openings of the passivation layer 150 by any known metallization method using any known conductive material such as a metal, but is not limited thereto.

The electrical connection structures 170 may be additionally configured to physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto. The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 120P, or may be provided in an amount of several tens to several thousands or more or several tens to several thousands or less.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The cover layer 180 may protect the core member 110 from external physical or chemical damage. A material of the cover layer 180 is not particularly limited. For example, an insulating material may be used as the material of the cover layer. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

Figure 12:
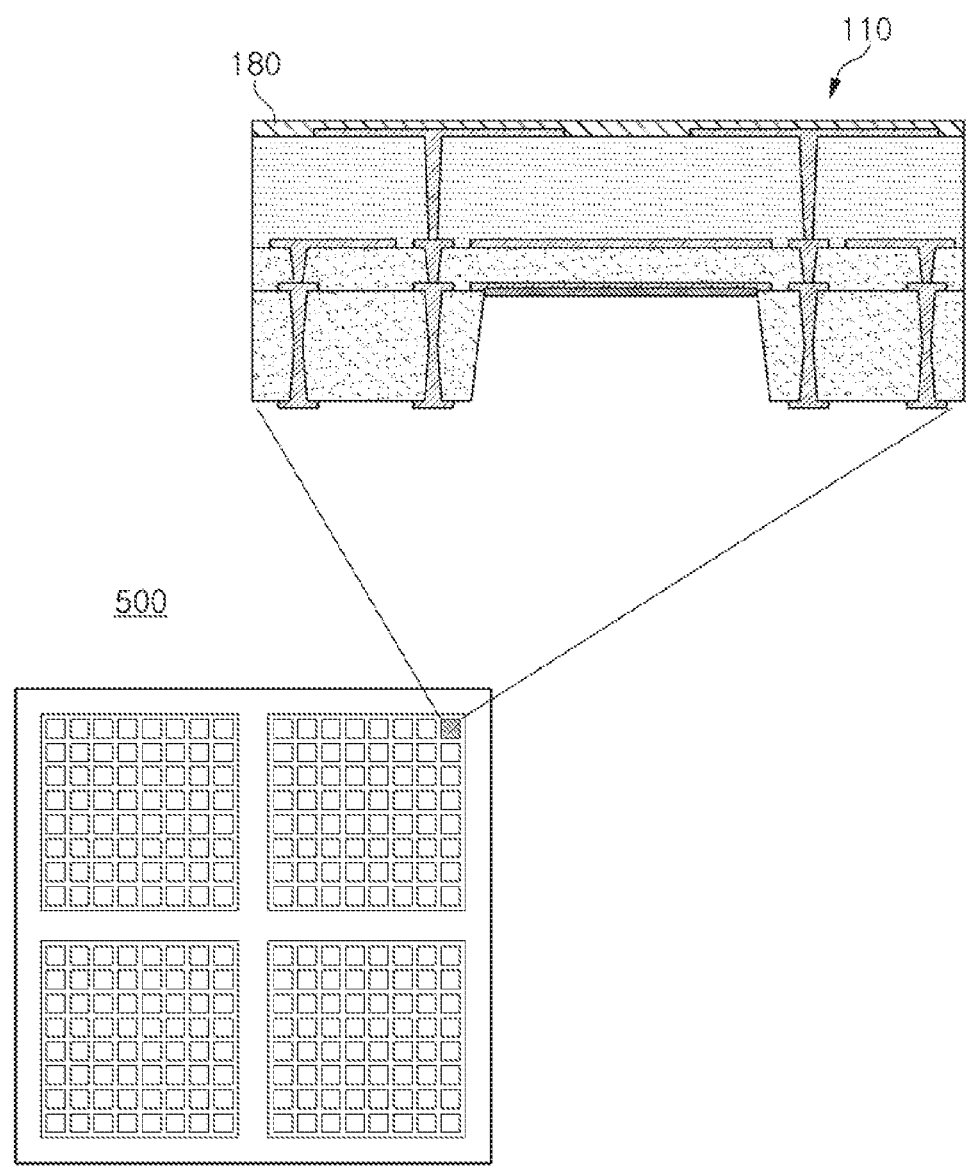
FIG. 12 is a schematic view illustrating an example of a panel used to manufacture the fan-out semiconductor package of FIG. 9.

FIG. 12 is a schematic view illustrating an example of a panel used to manufacture the fan-out semiconductor package of FIG. 9.

Referring to FIG. 12, the core member 110 may be formed using a panel 500 having a large area. For example, when the core members 110 including the antenna patterns 112dA-1 and 112dA-2, the ground patterns 112cG, the feeding lines 113F-1 and 113F-2, and the like are implemented in an array form on a multilayer PCB panel having a large area, the blind cavities 110H having the blind form are formed in the respective core members 110, the semiconductor chips 120 are attached to the respective blind cavities 110H, the feeding lines 113F-1 and 113F-2 of the antenna patterns 112dA-1 and 112dA-2 and general control signals of the semiconductor chips 120 are connected to each other by forming the redistribution layer 142 to manufacture a single fan-out semiconductor package, and the single fan-out semiconductor package is diced into the respective fan-out semiconductor packages 100A by a dicing process, a large number of fan-out semiconductor packages 100A may be manufactured by performing processes once. Meanwhile, when the panel 500 is used, a manufacturing process may be simple and a cost may be reduced. For example, grounds for the antenna patterns 112dA-1 and the 112dA-2 or various other signal patterns may be solved by only the ground patterns 112cG. In addition, it may be more effective in controlling warpage of the fan-out semiconductor package 100A that the core member 110 formed on the basis of the single panel 500 as described above surrounds the semiconductor chip 120, and when a metal layer is formed on the walls of the blind cavity 110H of the core member 110, the metal layer may seamlessly surround the semiconductor chip 120, and a heat dissipation effect or an electromagnetic wave blocking effect may thus be very excellent.

Figure 13A:
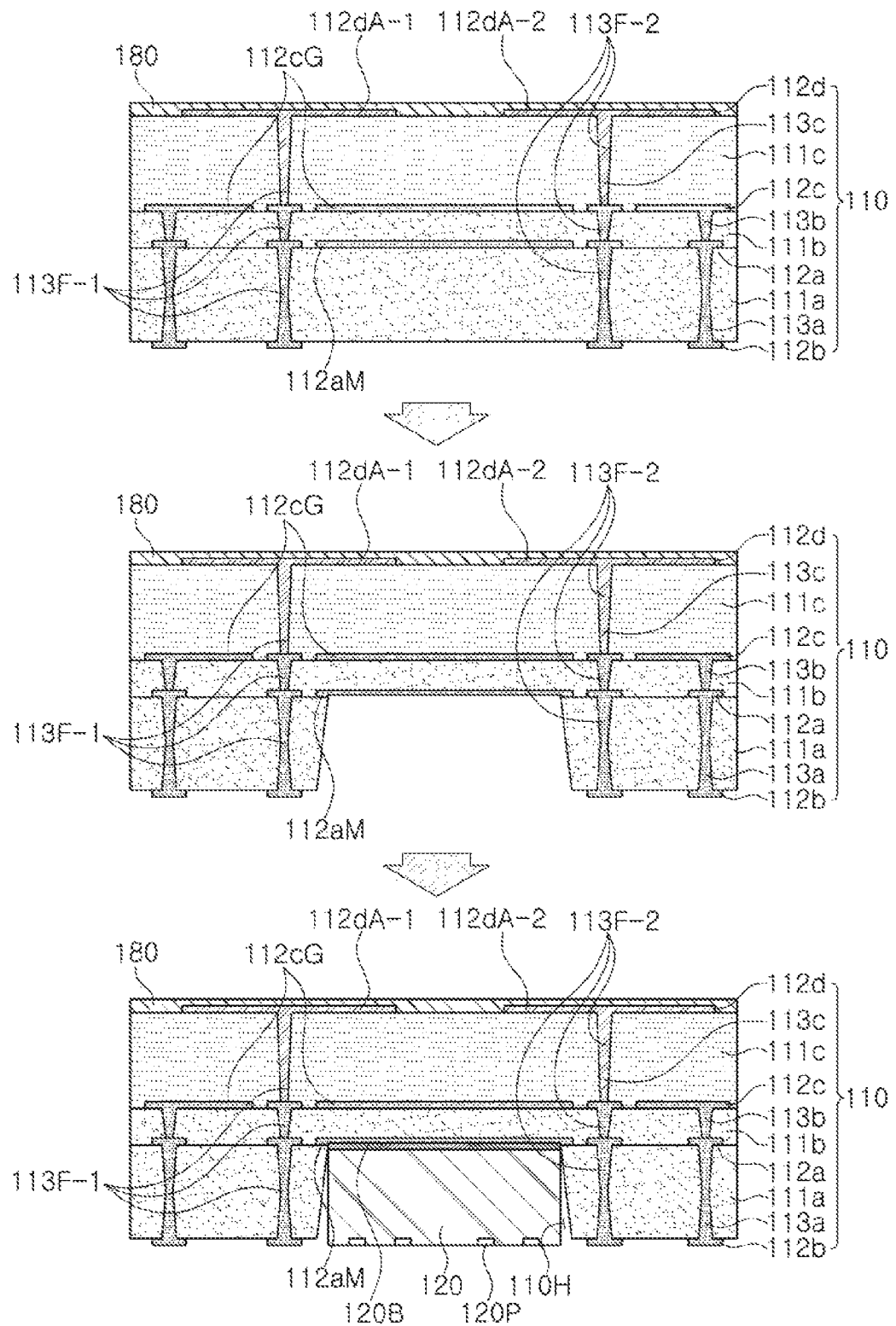
FIGS. 13A and 13B are schematic views illustrating an example of processes of manufacturing the fan-out semiconductor package of FIG. 9.
Figure 13B:
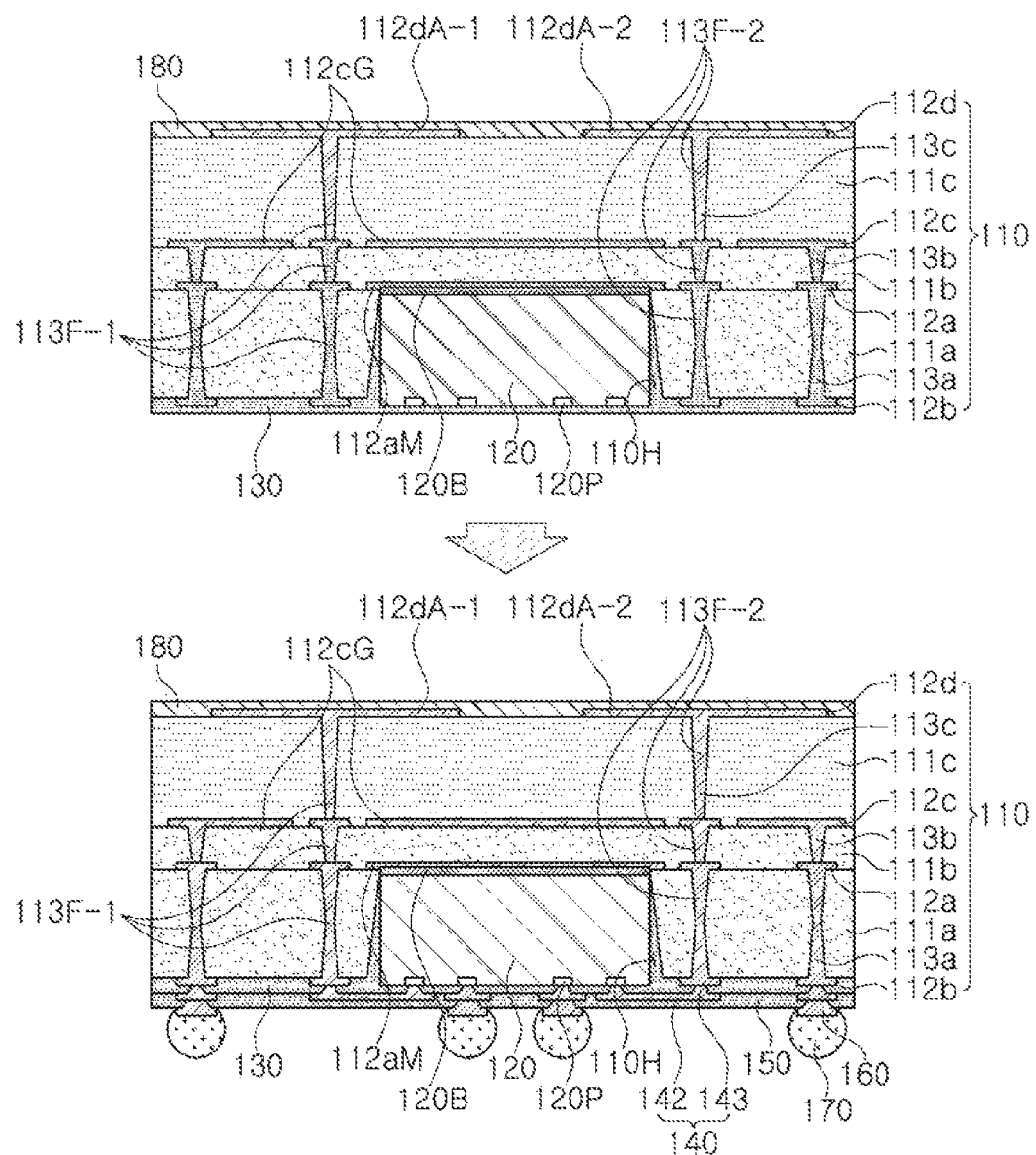

FIGS. 13A and 13B are schematic views illustrating an example of processes of manufacturing the fan-out semiconductor package of FIG. 9.

Referring to FIG. 13A, the core member 110 may be prepared. The core member 110 may be prepared by forming the first insulating layer 111a and the first and second wiring layers 112a and 112b and the first vias 113a formed on, beneath, and in the first insulating layer 111a using a copper clad laminate (CCL), or the like, forming the second insulating layer 111b on the first insulating layer 111a using ABF, or the like, forming the third wiring layer 112c and the second vias 113b on and in the second insulating layer 111b, forming the third insulating layer 111c on the second insulating layer 111b using a CCL, or the like, and forming the fourth wiring layer 112d and the third vias 113c on and in the third insulating layer 111c. The wiring layers 112a, 112b, 112c, and 112d may be formed by any known plating process, and the vias 113a, 113b, and 113c may be formed by forming via holes by a laser drill, or the like, and then filling the via holes by plating. The cover layer 180 may be formed on the core member 110 using ABF, or the like. Then, the blind cavity 110H may be formed using the barrier pattern 112aM of the second wiring layer 112b as a stopper. The blind cavity 110H may be formed using a mechanical drill and/or a laser drill or be formed by a sandblast, or the like, and when the sandblast is used, the blind cavity may have an inclination in a tapered shape. Then, the semiconductor chip 120 may be disposed in the blind cavity 110H. The semiconductor chip 120 may be disposed so that the inactive surface is attached to the barrier pattern 112aM, and the adhesion member 120B, or the like, may be used to attach the inactive surface of the semiconductor chip 120 to the barrier pattern 112aM.

Then, referring to FIG. 13B, the encapsulant 130 may be formed. The encapsulant 130 may be formed by stacking a film in a b-stage and then hardening the film or be formed by applying a liquid-phase material for forming the encapsulant 130 by any known coating method and then hardening the liquid-phase material. Then, the redistribution 142 and the vias 143 may be formed on and in the encapsulant 130 to form the connection member 140, and the passivation layer 150, the underbump metal layer 160, and the electrical connection structures 170 may be formed. Meanwhile, the redistribution layer 142 may be formed by any known plating process, and the vias 143 may be formed by forming via holes and then filling the via holes by plating. The passivation layer 150 may be formed by laminating ABF, or the like, the underbump metal layer 160 may be formed by any known metallization method, and the electrical connection structures 170 may be formed by forming low melting point metals such as tin (Sn)-aluminum (Al)-copper (Cu) alloys and then performing a reflow process on the low melting point metals. However, methods of forming the passivation layer 150, the underbump metal layer 160, and the electrical connection structures 170 are not limited thereto.

Figure 14:
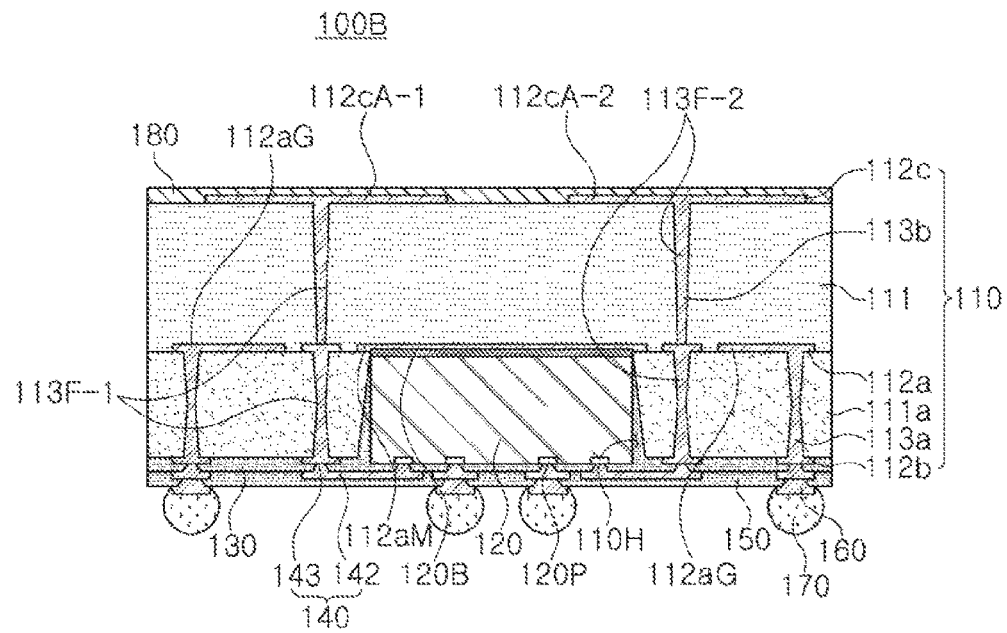
FIG. 14 is a schematic cross-sectional view illustrating another example of a fan-out semiconductor package.

FIG. 14 is a schematic cross-sectional view illustrating another example of a fan-out semiconductor package.

Referring to FIG. 14, in a fan-out semiconductor package 100B according to another exemplary embodiment in the present disclosure, a core member 110 may include a first insulating layer 111a, a first wiring layer 112a disposed on a first surface of the first insulating layer 111a, a second wiring layer 112b disposed on a second surface of the first insulating layer 111a, a second insulating layer 111b disposed on the first surface of the first insulating layer 111a and covering the first wiring layer 112a, and a third wiring layer 112c disposed on the second insulating layer 111b. In addition, the core member 110 may include first vias 113a penetrating through the first insulating layer 111a and electrically connecting the first and second wiring layers 112a and 112b to each other and second vias 113b penetrating through the second insulating layer 111b and electrically connecting the first and third wiring layers 112a and 112c to each other. The first to third wiring layers 112a, 112b, and 112c may be connected to connection pads 120 of a semiconductor chip 120 through a redistribution layer 142. That is, one insulating layer, one redistribution layer, and one via layer are reduced as compared to the fan-out semiconductor package 100A according to the exemplary embodiment described above.

The respective insulating layers 111a and 111b may include the same material or include different materials. As a non-restrictive example, the material of the first insulating layer 111a may be a material having low dielectric constant characteristics for reducing loss of a filter, and the material of the second insulating layer 111b may be a material having high dielectric constant characteristics for reducing a size of an antenna, or vice versa. The first insulating layer 111a may have a thickness corresponding to that of the semiconductor chip 120, and the second insulating layer 111b may have a thickness enough to secure a distance between antenna patterns 112cA-1 and 112cA-2 and ground patterns 112aG.

The first wiring layer 112a may include general redistribution patterns such as signal lines, power lines, ground lines, signal pads, power pads, ground pads, and the like. The first wiring layer 112a may include a barrier pattern 112aM, which may also be utilized as the ground patterns 112aG. The ground patterns 112aG may serve as a ground of various signal patterns, and the like, as well as the antenna patterns 112cA-1 and 112cA-2. The third wiring layer 112c may include the antenna patterns 112cA-1 and 112cA-2. Meanwhile, the third wiring layer 112c may include filter patterns (not illustrated) such as microstrip lines, strip lines, and the like.

Other configurations and manufacturing processes overlap those described above, and a detailed description thereof is thus omitted.

Figure 15:
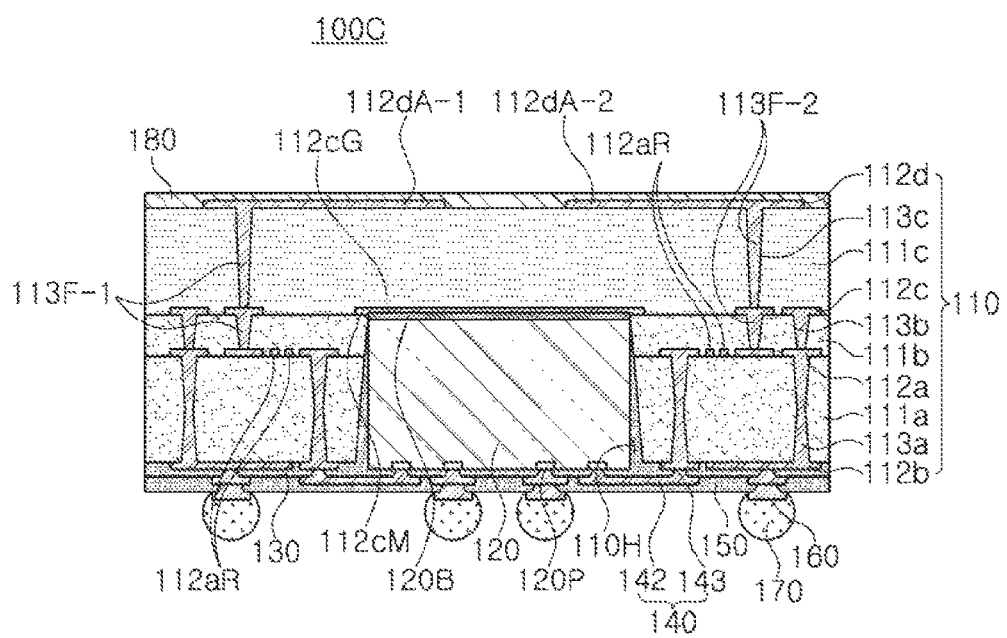
FIG. 15 is a schematic cross-sectional view illustrating another example of a fan-out semiconductor package.

FIG. 15 is a schematic cross-sectional view illustrating another example of a fan-out semiconductor package.

Referring to FIG. 15, a fan-out semiconductor package 100C according to another exemplary embodiment in the present disclosure may be substantially the same as the fan-out semiconductor package 100A according to the exemplary embodiment described above except that a first wiring layer 112a of a core member 110 includes filter patterns 112aR such as microstrip liens, strip lines, or the like. The filter patterns 112aR may have one ends connected to connection pads 120P of a semiconductor chip 120 and the other ends connected to feeding lines 113F-1 and 113F-2 of antenna patterns 112dA-1 and 112dA-2. The connection pads 120P and the antenna patterns 112dA-1 and 112dA-2 may be connected to each other through the filter patterns 112aR in a signal manner. The filter patterns 112aR may also be formed on a second wiring layer 112b in some cases. Ground patterns 112cG may serve as a ground for the filter patterns 112aR. Meanwhile, a blind cavity 110H may penetrate through first and second insulating layers 111a and 111b, and a barrier patterns 112cM may also be utilized as the ground patterns 112cG. That is, the barrier pattern 112cM may be disposed on a first surface of the second insulating layer 111b, and a first surface of the barrier pattern 112cM may be covered by a third insulating layer 111c and at least a portion of a second surface of the barrier pattern 112cM opposing the first surface of the barrier pattern 112cM may be exposed by the blind cavity 110H. The blind cavity 110H may penetrate through the first and second insulating layers 111a and 111b. Walls of the blind cavity 110H formed in the first and second insulating layers 111a and 111b may have a gradient of an acute angle. A thickness of an edge region of the barrier pattern 112cM in contact with the second insulating layer 111b may be greater than that of a region of the barrier pattern 112cM exposed from the second insulating layer 111b by the blind cavity 110H. The reason is that a portion of the exposed region may also be removed in a sandblast process.

Other configurations and manufacturing processes overlap those described above, and a detailed description thereof is thus omitted.

Figure 16:
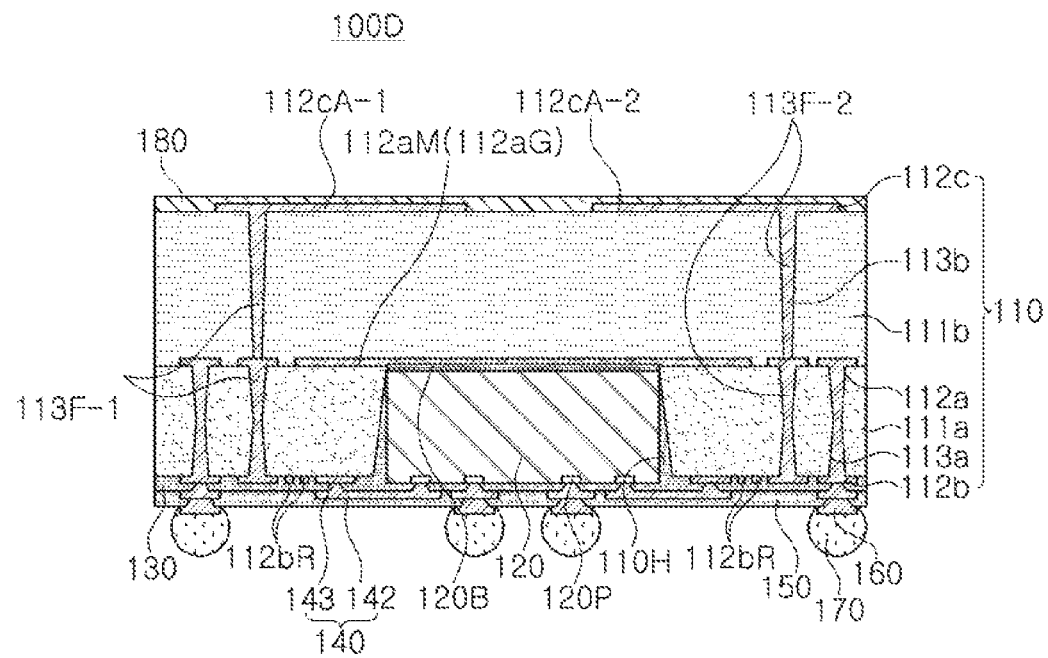
FIG. 16 is a schematic cross-sectional view illustrating another example of a fan-out semiconductor package.

FIG. 16 is a schematic cross-sectional view illustrating another example of a fan-out semiconductor package.

Referring to FIG. 16, a fan-out semiconductor package 100D according to another exemplary embodiment in the present disclosure may be substantially the same as the fan-out semiconductor package 100B according to another exemplary embodiment described above except that a second wiring layer 112b of a core member 110 includes filter patterns 112bR such as microstrip lines, strip lines, or the like. The filter patterns 112bR may have one ends connected to connection pads 120P of a semiconductor chip 120 and the other ends connected to feeding lines 113F-1 and 113F-2 of antenna patterns 112cA-1 and 112cA-2. The connection pads 120P and the antenna patterns 112cA-1 and 112cA-2 may be connected to each other through the filter patterns 112bR in a signal manner. Ground patterns 112aG may serve as a ground for the filter patterns 112bR.

Other configurations and manufacturing processes overlap those described above, and a detailed description thereof is thus omitted.

In the fan-out semiconductor package according to the present disclosure described above, a millimeter wave antenna integrated RFIC product may be developed, a millimeter wave antenna/filter/RFIC integrated package module may be developed, stable antenna radiation characteristics of a millimeter wave antenna may be secure, antenna radiation characteristics may be maintained by only a package itself to maintain robustness to a surrounding change of a main PCB, an error between a patch antenna pattern and a ground plane may be reduced to secure stable performance, stable performance may be secured regardless of pollution of a bottom surface of the package, a selective structure may be applied for each product, such as enhancement of heat dissipation characteristics, securing of low loss characteristics, or the like, heat generated from the RFIC may be efficiently dissipated to a main PCB to improve RF performance, a material having a high dielectric constant may be used as a material of a core layer to reduce a size of an antenna and thus reduce an overall size of a package, a package having a size significantly reduced as compared to an existing package may be provided through a blind cavity structure and a stack type package module, a material having a high dielectric constant may be used as a material of an antenna portion in order to reduce the size of the antenna, and a material having a low dielectric constant may be selectively used as a material of a bottom package in order to reduce loss of feeding lines.

As set forth above, according to the exemplary embodiments in the present disclosure, a fan-out semiconductor package in which loss of a signal transfer may be prevented by significantly reducing a distance between a semiconductor chip and an antenna pattern, stable antenna performance may be secured in a single package, an overall size of a package may be reduced, and a process may be simplified may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a core member including a plurality of insulating layers and a plurality of wiring layers and having a blind cavity penetrating through a portion of the plurality of insulating layers;
a semiconductor chip disposed in the blind cavity and having an active surface having connection pads disposed thereon and an inactive surface opposing the active surface;
an encapsulant encapsulating at least portions of the core member and the active surface of the semiconductor chip and filling at least portions of the blind cavity; and
a connection member disposed on the core member and the active surface of the semiconductor chip and including a redistribution layer connected to the connection pads,
wherein the plurality of wiring layers include antenna patterns and ground patterns,
the antenna patterns and the ground patterns are disposed on different levels, and
the antenna patterns are connected to the connection pads through the redistribution layer.

2. The fan-out semiconductor package of claim 1, wherein the plurality of wiring layers further include filter patterns, and
the antenna patterns are connected to the connection pads through the filter patterns and the redistribution layer in a signal manner.

3. The fan-out semiconductor package of claim 1, wherein the plurality of wiring layers further include a barrier pattern,
a portion of the barrier patterns is exposed from the portion of the plurality of insulating layers by the blind cavity, and
the inactive surface of the semiconductor chip is attached to exposed one surface of the barrier pattern.

4. The fan-out semiconductor package of claim 3, wherein the core member includes a first insulating layer, a first wiring layer disposed on a first surface of the first insulating layer, a second wiring layer disposed on a second surface of the first insulating layer, first vias penetrating through the first insulating layer and connecting the first and second wiring layers to each other, a second insulating layer disposed on the first surface of the first insulating layer and covering the first wiring layer, a third wiring layer disposed on the second insulating layer, and second vias penetrating through the second insulating layer and connecting the first and third wiring layers to each other,
the first wiring layer includes the ground patterns and the barrier pattern,
the third wiring layer includes the antenna patterns, and
the blind cavity penetrates through the first insulating layer.

5. The fan-out semiconductor package of claim 4, wherein the second wiring layer includes filter patterns, and
the antenna patterns are connected to the connection pads through the filter patterns and the redistribution layer in a signal manner.

6. The fan-out semiconductor package of claim 4, wherein the barrier pattern serves as the ground pattern.

7. The fan-out semiconductor package of claim 4, wherein a dielectric of the second insulating layer has a dielectric constant greater than that of a dielectric of the first insulating layer.

8. The fan-out semiconductor package of claim 3, wherein the core member includes a first insulating layer, a first wiring layer disposed on a first surface of the first insulating layer, a second wiring layer disposed on a second surface of the first insulating layer, first vias penetrating through the first insulating layer and connecting the first and second wiring layers to each other, a second insulating layer disposed on the first surface of the first insulating layer and covering the first wiring layer, a third wiring layer disposed on the second insulating layer, second vias penetrating through the second insulating layer and connecting the first and third wiring layers to each other, a third insulating layer disposed on the second insulating layer and covering the third wiring layer, a fourth wiring layer disposed on the third insulating layer, and third vias penetrating through the third insulating layer and connecting the third and fourth wiring layers to each other,
the third wiring layer includes the ground patterns, and
the fourth wiring layer includes the antenna patterns.

9. The fan-out semiconductor package of claim 8, wherein at least one of the first and second wiring layers includes filter patterns, and
the antenna patterns are connected to the connection pads through the filter patterns and the redistribution layer in a signal manner.

10. The fan-out semiconductor package of claim 8, wherein the first wiring layer includes the barrier pattern, and
the blind cavity penetrates through the first insulating layer.

11. The fan-out semiconductor package of claim 8, wherein the third wiring layer includes the barrier pattern, and
the blind cavity penetrates through the first and second insulating layers.

12. The fan-out semiconductor package of claim 11, wherein the barrier pattern serves as the ground pattern.

13. The fan-out semiconductor package of claim 8, wherein a dielectric of the third insulating layer has a dielectric constant greater than that of a dielectric of the first insulating layer.

14. The fan-out semiconductor package of claim 3, wherein the barrier pattern is a metal plate.

15. The fan-out semiconductor package of claim 3, wherein a thickness of an edge region of the barrier pattern in contact with two of the plurality of insulating layers is greater than that of a region of the barrier pattern exposed from the portion of the plurality of insulating layers by the blind cavity.

16. The fan-out semiconductor package of claim 1, wherein the antenna patterns include transmission antenna patterns and receive antenna patterns.

17. The fan-out semiconductor package of claim 1, wherein walls of the blind cavity have a gradient of an acute angle in relation to one of the plurality of wiring layers.

18. The fan-out semiconductor package of claim 1, wherein the antenna patterns and the ground patterns at least partially overlap with each other in a stacking direction of the plurality of insulating layers.

19. The fan-out semiconductor package of claim 1, wherein among the plurality of insulating layers, the insulating layer on which the antenna patterns are directly disposed has the greatest dielectric constant.

\* \* \* \* \*